United States Patent
Fahrenbruch

(10) Patent No.: US 9,625,559 B2
(45) Date of Patent: Apr. 18, 2017

(54) CORRECTING ACCUMULATED POWER IN UTILITY METERS

(71) Applicant: General Electric Company, Schenectady, NY (US)

(72) Inventor: John Kirk Fahrenbruch, Sanford, ME (US)

(73) Assignee: General Electric Company, Schenectady, NY (US)

( * ) Notice: Subject to any disclaimer, the term of this patent is extended or adjusted under 35 U.S.C. 154(b) by 734 days.

(21) Appl. No.: 13/647,238

(22) Filed: Oct. 8, 2012

(65) Prior Publication Data

US 2014/0100809 A1    Apr. 10, 2014

(51) Int. Cl.
*G01R 35/00*    (2006.01)
*G06F 19/00*    (2011.01)
*G01R 35/04*    (2006.01)

(52) U.S. Cl.
CPC .................................. *G01R 35/04* (2013.01)

(58) Field of Classification Search
CPC .......... G01R 35/00; G01R 35/04; G06F 19/00
USPC .......... 702/60–62, 85, 64, 77; 323/207, 205; 324/142; 361/664; 375/283, 285; 455/226.1
See application file for complete search history.

(56) References Cited

U.S. PATENT DOCUMENTS

| | | | | |
|---|---|---|---|---|
| 4,504,787 A * | 3/1985 | Planer | ................... | G01R 21/133 324/117 R |
| 5,122,735 A * | 6/1992 | Porter et al. | ................... | 324/142 |
| 5,391,983 A * | 2/1995 | Lusignan et al. | ............. | 324/142 |
| 5,869,960 A * | 2/1999 | Brand | ........................... | 324/142 |
| 6,262,672 B1 * | 7/2001 | Brooksby et al. | ......... | 340/870.1 |
| 6,609,048 B2 * | 8/2003 | Matsuo et al. | ................ | 700/291 |
| 7,541,800 B2 * | 6/2009 | Lee et al. | ...................... | 324/127 |
| 8,000,911 B2 * | 8/2011 | Carter et al. | .................... | 702/60 |
| 8,040,237 B2 * | 10/2011 | Nielsen et al. | .......... | 340/539.13 |
| 8,116,072 B2 * | 2/2012 | Kagan et al. | ................. | 361/664 |
| 8,138,704 B2 * | 3/2012 | Chakrabarti et al. | ......... | 318/432 |
| 8,218,705 B2 * | 7/2012 | Yousefi Moghaddam et al. | ............................. | 375/376 |
| 8,385,910 B2 * | 2/2013 | Nazrul et al. | ................ | 455/425 |
| 8,558,496 B2 * | 10/2013 | Welchko et al. | ............. | 318/445 |
| 8,572,142 B2 * | 10/2013 | Shah | ........................... | 708/250 |
| 8,603,323 B2 * | 12/2013 | Kranendonk et al. | ........ | 205/792 |

(Continued)

FOREIGN PATENT DOCUMENTS

WO    01/01079 A1    1/2001
WO    03/025878 A2    3/2003

OTHER PUBLICATIONS

Understanding the Most and Least Significant Bit (http://bit-calculator.com/most-and-least-significant-bit).*

(Continued)

*Primary Examiner* — John H Le
(74) *Attorney, Agent, or Firm* — Stephen J. Terrell; Parks IP Law LLC

(57) ABSTRACT

A system includes a utility meter. The utility meter includes a first sensor configured to detect a usage, a generation, or a combination thereof of electric power, and a power detection and correction system configured to detect and correct an inaccuracy with a measurement of an electrical voltage, electrical current, or a combination thereof from the first sensor. The power detection and correction system includes a processor configured to execute a program stored in a memory of the utility meter.

12 Claims, 4 Drawing Sheets

(56) References Cited

U.S. PATENT DOCUMENTS

| | | | | |
|---|---|---|---|---|
| 8,615,210 | B2* | 12/2013 | Mantravadi et al. | 455/226.1 |
| 8,849,472 | B2* | 9/2014 | Pugh et al. | 700/295 |
| 8,892,266 | B2* | 11/2014 | Rossi et al. | 700/291 |
| 8,922,194 | B2* | 12/2014 | Blake et al. | 324/96 |
| 8,941,261 | B2* | 1/2015 | Shaffer | 307/18 |
| 2002/0162014 | A1* | 10/2002 | Przydatek et al. | 713/200 |
| 2009/0045804 | A1* | 2/2009 | Durling et al. | 324/140 R |
| 2009/0299666 | A1* | 12/2009 | Kang | G01R 19/0015 702/77 |
| 2011/0248567 | A1* | 10/2011 | Brown et al. | 307/48 |
| 2012/0169300 | A1* | 7/2012 | Rouaud et al. | 323/207 |

OTHER PUBLICATIONS

European search report issued in connection with EP application No. 13189051.9 dated Apr. 4, 2014.

\* cited by examiner

CORRECTING ACCUMULATED POWER IN UTILITY METERS

BACKGROUND

The invention relates generally to detection and correction, and more particularly to methods and systems for the detection and correction of accumulated power in utility meters.

Infrastructure, such as a smart grid, includes a variety of systems and components with sensors. In the smart grid example, systems may include power generation systems, power transmission systems, meters, digital communications systems, control systems, and their related components. Certain meters include a variety of sensors. Unfortunately, the meters may be susceptible to possibly registering incorrect power usage and generation.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In one embodiment, a system includes a utility meter. The utility meter includes a first sensor configured to detect a usage, a generation, or a combination thereof of electric power, and a power detection and correction system configured to detect and correct an inaccuracy with a measurement of an electrical voltage, electrical current, or a combination thereof from the first sensor. The power detection and correction system includes a processor configured to execute a program stored in a memory of the utility meter.

In a second embodiment, a system includes a tangible machine readable medium including power detection and correction instructions configured to measure an electrical voltage, measure an electrical current, and calculate a power using the measured electrical voltage and the measured electrical current over a time interval. The power detection and correction instructions are configured to determine if the calculated power is delivered over the time interval and add the calculated power to a total accumulation of electrical power received by a utility meter if the calculated power is delivered over the time interval. The power detection and correction instructions are configured to determine if the calculated power is received over the time interval and subtract the calculated power from the total accumulation of electrical power received by the utility meter if the calculated power is received over the time interval.

In a third embodiment, a method includes detecting an inaccuracy related to a measurement of an electrical voltage, electrical current, or a combination thereof from a sensor of a utility meter. The sensor is configured to provide an indication of an electrical power usage used by an end user, an electrical power generation generated by an end user, or a combination thereof.

DRAWINGS

These and other features, aspects, and advantages of the present invention will become better understood when the following detailed description is read with reference to the accompanying drawings in which like characters represent like parts throughout the drawings, wherein.

Figure 2:
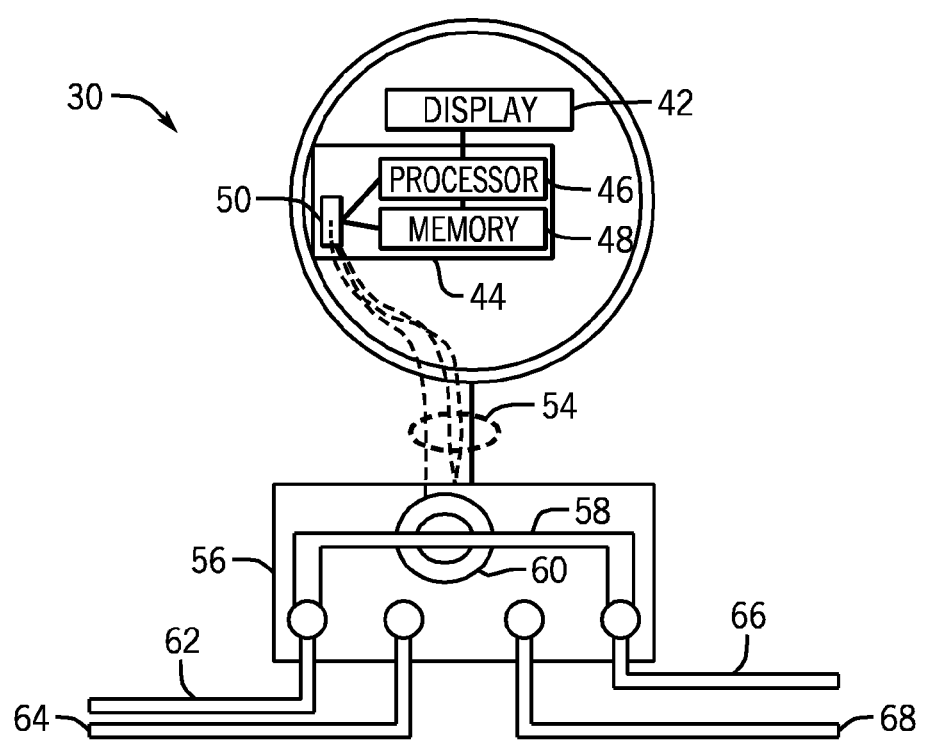
FIG. 2 is a schematic diagram of an embodiment of a power detection and correction meter system included in the system of FIG. 1.
Figure 4:
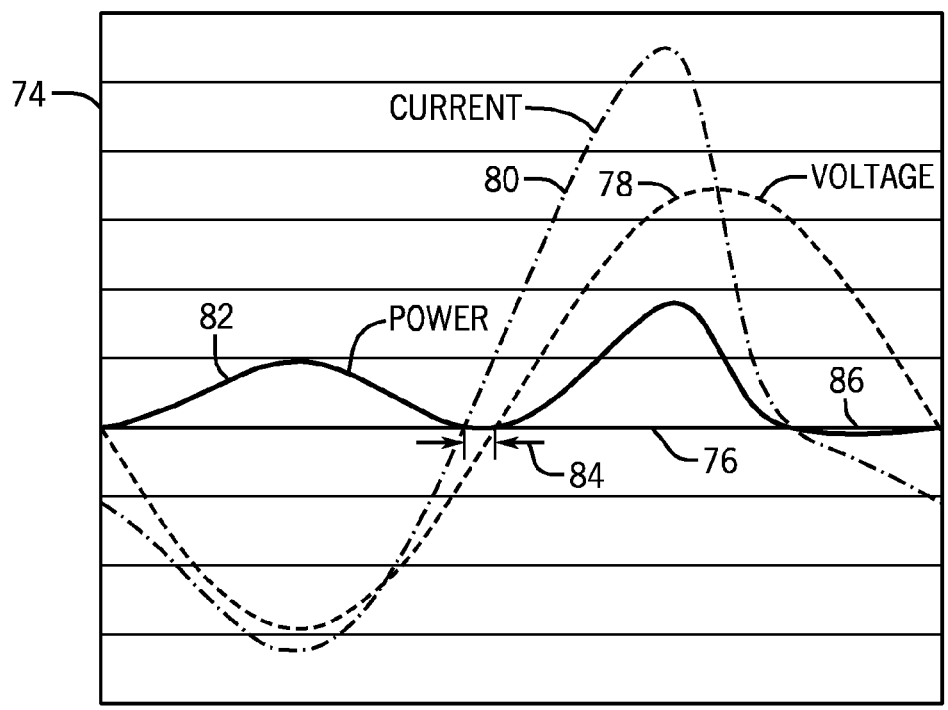
Figure 5:
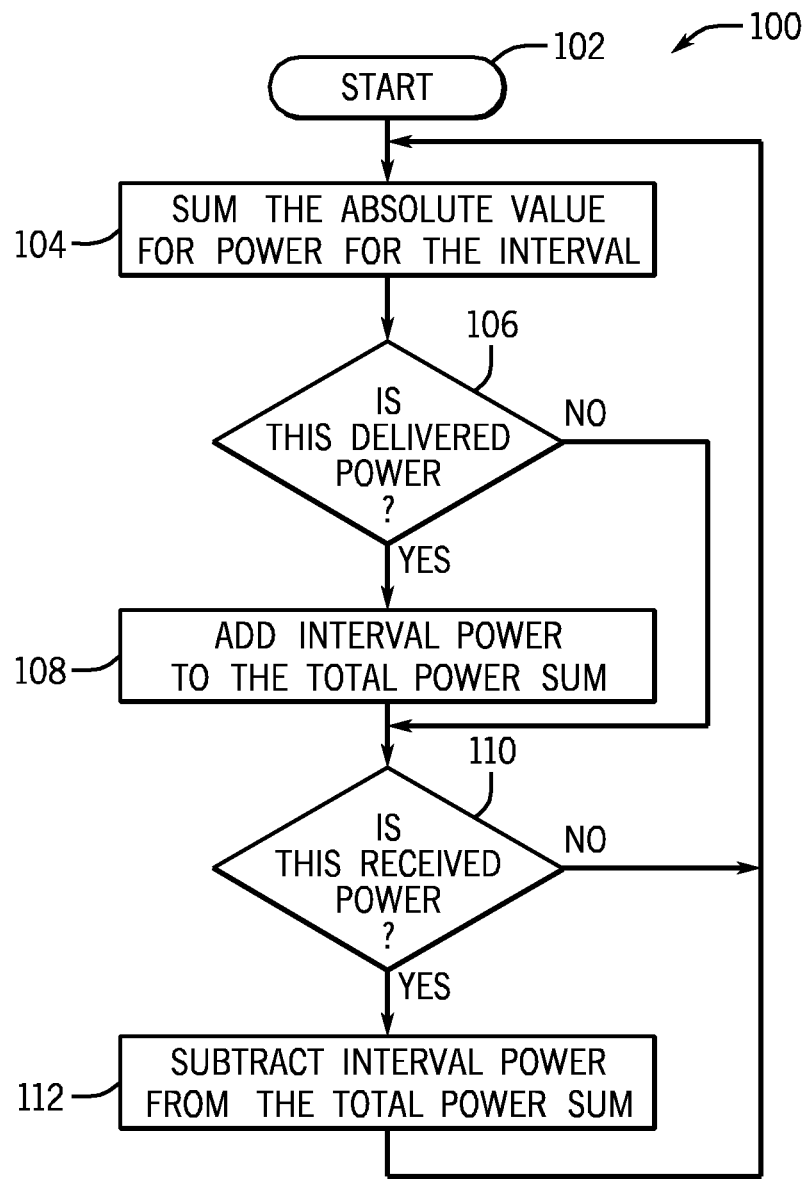

FIG. 4 is a diagram of a voltage, a current, a shift in the zero crossing between the voltage and current, and a power output of the a power detection and correction meter system of FIG. 2, in accordance with an embodiment; and FIG. 5 is a flowchart of an embodiment of a process suitable for detecting and correcting the accumulation of power in the power detection and correction meter system of FIG. 2.

DETAILED DESCRIPTION

One or more specific embodiments of the invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the invention, the articles "a," "an," "the," and "said" are intended to mean that there are one or more of the elements. The terms "comprising," "including," and "having" are intended to be inclusive and mean that there may be additional elements other than the listed elements.

Certain infrastructure, such as an electric smart grid, may include a variety of interconnected systems and components. For example, the smart grid may include power generation systems, power transmission and distribution systems, metering systems, digital communications systems, control systems, and their related components. Smart meters incorporate many functionalities relating to the consumption of utilities, such as water, electricity, gas, and so forth. For example, smart meters may enable a utility provider, such as an electricity provider, to remotely monitor consumer use of the utility. Smart meters may also include a number of sensors to detect and measure the amount of power a consumer uses or generates. However, should an alternating current (AC) signal be offset by a direct current (DC) component of the AC signal, a shift or deformation of the consumed and/or generated power may become apparent due to a physical response of the sensor. This may result in inaccurate accumulation of power usage or power generation. For example, a consumer may not be billed by the utility for the correct total amount of power used, or likewise, the consumer may not be credited by the utility for the correct total amount of power generated.

Present embodiments include the detection and correction of the accumulation of power measured and registered by smart meters. By detecting, recording, and computing the absolute value of power either delivered or received from a consumer or other load over given time intervals, and summing the total accumulation of power, the systems and methods described herein may ensure that the smart meter may compute and measure power either used or generated over a time interval as a positive value, thus yielding the correct accumulation of power delivered or received from a consumer or other load. As will be further appreciated, the techniques described herein may be retrofitted to existing smart meters without adding (or removing) hardware components.

Figure 1:
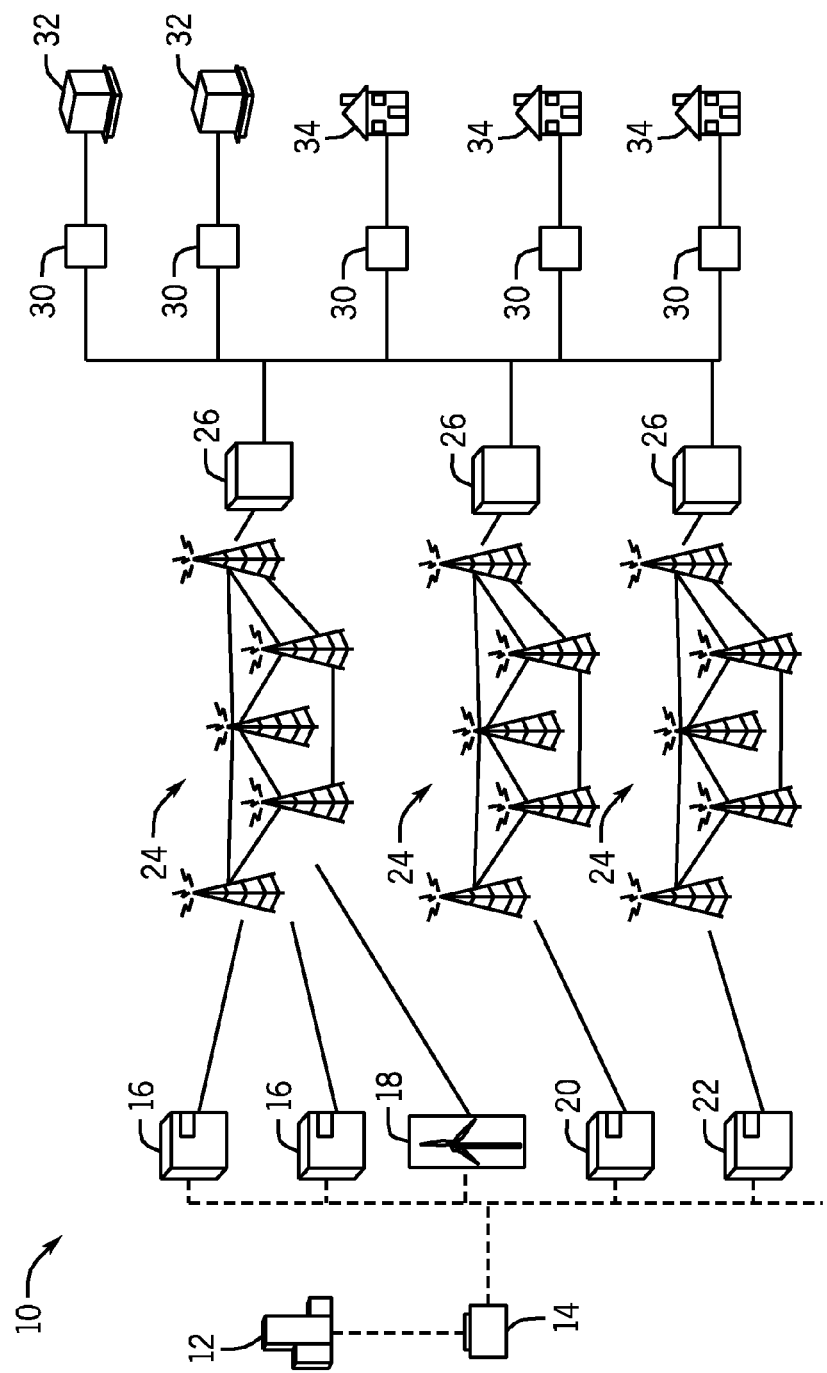
FIG. 1 is a block diagram of an embodiment of an intelligent generation, transmission, and distribution infrastructure (e.g., a smart grid infrastructure) system.

With the foregoing in mind, it may be useful to describe an embodiment of an infrastructure, such as an example smart grid system 10 illustrated in FIG. 1. As depicted, the smart grid system 10 may include one or more utilities 12. The utility 12 may provide for oversight operations of the smart grid system 10. For example, utility control centers 14 may monitor and direct power produced by one or more power generation stations 16 and alternative power generation stations 18. The power generation stations 16 may include conventional power generation stations, such as power generation stations using gas, coal, biomass, and other carbonaceous products for fuel. The alternative power generation stations 18 may include power generation stations using solar power, wind power, hydroelectric power, geothermal power, and other alternative sources of power (e.g., renewable energy) to produce electricity. Other infrastructure components may include a water power producing plant 20 and geothermal power producing plant 22. For example, water power producing plants 20 may provide for hydroelectric power generation, and geothermal power producing plants 22 may provide for geothermal power generation.

The power generated by the power generation stations 16, 18, 20, and 22 may be transmitted through a power transmission grid 24. The power transmission grid 24 may cover a broad geographic region or regions, such as one or more municipalities, states, or countries. The transmission grid 24 may also be a single phase alternating current (AC) system, but most generally may be a three-phase AC current system. As depicted, the power transmission grid 24 may include a series of towers to support a series of overhead electrical conductors in various configurations. For example, extreme high voltage (EHV) conductors may be arranged in a three conductor bundle, having a conductor for each of three phases. The power transmission grid 24 may support nominal system voltages in the ranges of 110 kilovolts (kV) to 765 kilovolts (kV). In the depicted embodiment, the power transmission grid 24 may be electrically coupled to power distribution substation 26. The power distribution substation 26 may include transformers to transform the voltage of the incoming power from a transmission voltage (e.g., 765 kV, 500 kV, 345 kV, or 138 kV) to primary (e.g., 13.8 kV or 4160V) and secondary (e.g., 480V, 230V, or 120V) distribution voltages. For example, industrial electric power consumers (e.g., production plants) may use a primary distribution voltage of 13.8 kV, while power delivered to commercial and residential consumers may be in the secondary distribution voltage range of 120V to 480V.

As again depicted in FIG. 1, the power transmission grid 24 and power distribution substation 26 may be part of the smart grid system 10. Accordingly, the power transmission grid 24 and power distribution substation 26 may include various digital and automated technologies to control power electronic equipment such as generators, switches, circuit breakers, reclosers, and so forth. The power transmission grid 24 and power distribution substation 26 may also include various communications, monitoring, and recording devices such as, for example, programmable logic controllers (PLC) and electric fault detecting protective relays. For example, during storms, a protective relay at power distribution substation 26 may detect an electrical fault downstream of the substation, and operate a circuit breaker to allow the fault to clear and restore electric power. In certain embodiments, the power transmission grid 24 and power distribution substation 26 may also communicate data such as changes in electric load demand to a power correction and detection metering system 30.

The power correction and detection metering system 30 may be an advanced metering infrastructure (AMI) meter used to measure, collect, and analyze electricity, water, and/or gas usage. The metering system 30 may be communicatively coupled to one or more of the components of the smart grid 10, including the power transmission grids 24 and power distribution substation 26. Additionally, the metering system 30 may enable two-way communication between commercial sites 32, residences 34, and the utility control center 14, providing for a link between consumer behavior and utility consumption (e.g., electric, water, and/or gas consumption). For example, metering system 30 may track and account for pre-paid electricity, water and/or gas in a similar fashion to pre-paid cell phone usage. Likewise, the utility's consumers 32 and 34 may benefit from lower utility charges by optimizing their utility use, for example, to take advantage of lower rates during low demand hours. Washer/dryers, electric car chargers, and other flexible power consumption appliances may be programmed to operate during low demand hours, resulting in lower utility bills and a more balanced utilization of energy. In certain embodiments, the metering system 30 may include a system of electrical and electronic components such as, for example, a display, processors, memory devices, sensors, bus bars, electrical conducting wires, and batteries. It should also be appreciated that the metering system 30 may measure, monitor, store, and display an apparent power (kVA), real power (i.e., the total power consumed by the resistive component of a given load over a time interval) (kW), and reactive power (i.e., the power consumed by the reactive component of a given load over a time interval) (kVar) as a product of power and time. For example, electric utilities may report to consumers their usage per kilowatt-hour (kWh) for billing purposes. The metering system 30 may also be powered, for example, via a 120 VAC source or battery supply. The metering system 30 may include certain systems, as described in more detail with respect to FIG. 2, suitable for detecting and correcting the inaccurate registered accumulation of power registered by the metering system 30. For example, a negative power may be more easily detected and corrected.

Turning now to FIG. 2, the figure is a schematic diagram of an embodiment of a power detection metering system 30. The metering system 30 may be included in the metering system 30, which may additionally include monitoring and communications functionalities, as previously discussed. The metering system 30 may be a single-phase or polyphase system. As also depicted, the metering system 30 may include a display 42 communicatively coupled to an electronic board 44 to display electricity consumption and generation in recorded time intervals or real-time. For example, the display 42 may be a liquid crystal display (LCD) to display parameters such as real power in watt-hours or kilowatt-hours (e.g., Wh or kWh), reactive power in var-hours or kilovar-hours (e.g., Varh or kVarh), current in amperes (A), voltage in volts (V), or some combination thereof. The display 42 may also display power (e.g., apparent, real, and reactive) delivered to the consumer 32, 34, from the utility 12, as well as power generated by the consumer 32, 34, to deliver to the grid 24, 26. For example, the consumer 32, 34 may interconnect a distributed generation (DG) resource (e.g., solar panels or wind turbines) to generate and deliver power to the distribution substation and grid 26.

In certain embodiments, the electronic board 44 may further include a processor 46 and/or other data processing and sensing circuitry that may be operatively coupled to a memory 48 to execute instructions for carrying out the presently disclosed techniques. These instructions may be encoded in programs or code stored in tangible non-transitory computer-readable medium, such as the memory 48 and/or other storage. The processor 46 may be a general purpose processor, system-on-chip (SoC) device, or some other processor configuration. The electronic board 44 may, in addition, include metrology circuitry, analog front end (AFE) circuitry, voltage reference circuitry, real-time clocks, data converters, and similar electronic circuitry and architectures. In an embodiment, the processor 46 and the memory 48 of the electronic board 44 may process, record, and store data received from a current sensor 60 of a bus bar 58 and source-side and load-side live and neutral conductors 62, 64, 66, and 68. For example, the processor 46 and the memory 48 of the electronic board 44 may, in time intervals or in real-time, sample single or poly-phase current (A), voltage (V), compute or process apparent power (e.g., VA or kVA), real power (e.g., W or kW), reactive power (e.g., Var or kVar), and power factor data, and report that data to the consumer or the utility. The processor 46 and memory 48 of the electronic board 44 may also support a number of embedded software and firmware applications and systems. For example, in certain embodiments, the processor 46 and memory 48 may support metrology, emulator, and sensing scheme applications and systems. The metrology circuitry and applications supported by the electronic board 44 may include code or instructions stored in a non-transitory machine-readable medium (e.g., memory 48) and used to read and analyze analog or digital current or voltage inputs, and determine if metering system 30 may have measured an accurate accumulation of power used or generated. In one embodiment, the instructions may be flash upgraded (e.g., transmitted via Ethernet cable, near field communication (NFC), and similar wired and/or wireless communication methods) to the electronic board 44, such that no additional hardware components is required by the metering system 30.

Furthermore, the electronic board 44 of the metering system 30 may also include a sensor input header 50 communicatively coupled to the processor 46 and the memory 48. In certain embodiments, the metering system 30 may also include one or more of the current sensor 60. The current sensor 60 may be electrically and/or communicatively coupled to the bus bar 58, and each of the current sensor 60 and the bus bar 58 may be housed inside a base 56. The bus bar 58 may be a bar or strip of conducting material (e.g., copper, aluminum, or other metals and metal alloys) for connecting the distribution substation 26 to an end user via the metering system 30.

In certain embodiments, the current sensor 60 may be any device that outputs a signal (e.g., AC/DC voltage or current) proportional to a detected electrical current flowing through the electrically and/or communicatively coupled bus bar 58. For example, the metering system 30 may be a 120 VAC residential power meter. The current sensor 60 may, for example, continuously monitor the current flowing through the bus bar 58 to detect events such as power outages, electrical faults, decreases in current due to load changes, and so forth. The current sensor 60 may then output a signal proportional to the current detected flowing through the bus bar 58 to the electronic board 44, where a determination may be made to communicate the current data to the consumer 32, 34 or the utility 12. The current sensor 60 may include a primary and secondary winding, and may produce in the secondary winding a current or voltage that is proportional to a load or line current flowing through the primary winding. Accordingly, in one embodiment, the current sensor 60 may be a current transformer (CT). In such an embodiment, the current sensor 60 may include a magnetic core, in which the primary winding of the current sensor 60 may be electrically and/or communicatively coupled to the source-side live and neutral conductors 62 and 64 and bus bar 58, and the secondary winding may be electrically and/or communicatively coupled to the electronic board 44 via electrical leads 54 and sensor input header 50. For example, the current sensor 60 may measure a load current in the range of a few amps (A) to a few kiloamps (kA) on the primary winding, and may produce on the secondary winding a current in the range of a few milliamps (mA) to few hundred milliamps (mA) for sensing and processing. In another embodiment, the current sensor 60 may include a burden resistor or other resistive component (e.g., shunt resistor), which may be used to measure an output voltage on the secondary side of current sensor 60.

As noted above, the current sensor 60 may also include the electrical leads 54, which may couple electrically at a first end to current sensor 60, and couple electrically at an opposing end to sensor input header 50. The electrical leads 54 may include power electrical leads, a neutral or ground electrical lead, data transmit and receive electrical leads, or any combination thereof. In some embodiments, the electrical leads 54 may be color-coded corresponding to the function of the lead. For example, the colors red and black may respectively correspond to power and neutral leads, while the colors white, blue, or green, for example, may correspond to data-carrying leads. The leads 54 may also further enable the current sensor 60 to output a signal (e.g., DC voltage) to the electronic board 44 that is proportional to the measured AC current of bus bar 58.

As previously discussed, the metering system 30 may also include the sensor input header 50. In certain embodiments, the sensor input header 50 may couple electrically and/or communicatively at one end to the current sensor 60 via electrical leads 54, and couple electrically and/or communicatively at the opposing end to the electronic board 44. The input header 50 may include analog inputs, discrete inputs, digital inputs, or some combination thereof. In certain embodiments, the sensor input header 50 may be configured as part of a power accumulation detection and correction mechanism of the metering system 30.

In certain embodiments, the processor 46 within the metering system 30 may perform a series of calculations to determine the amount of power measured by the metering system 30. For example, the processor 46 may sample, process, and store in the memory 48 the nominal voltage (e.g., 120 VAC) of bus bar 58, and may multiply the nominal voltage by the sampled value of the detected AC current of the bus bar 58 to determine a value for power. Further, the processor 46 may compute and measure, for example, single-phase or three-phase instantaneous (e.g., time-varying) or average (e.g., root-mean-square [RMS]) voltage, current, real, reactive and apparent power, power factor angle (e.g., the angle between the voltage and current), and so forth. As previously noted, a power (e.g., real or reactive) may be calculated at least by multiplying the nominal line or load voltage (e.g., V or kV) by a line or load current (e.g., A or kA) detected by current sensor 60 to produce a power (e.g., W, kW, Var and kVar).

Figure 3:
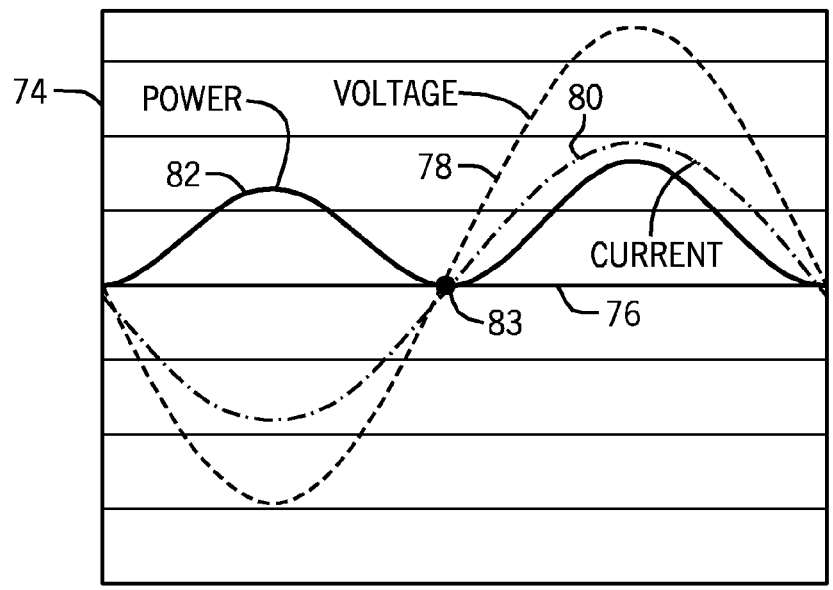
FIG. 3 is a diagram of a voltage, a current, and a power output of the a power detection and correction meter system of FIG. 2, in accordance with an embodiment.

In certain embodiments, the voltage and current measured or sampled by the processor 46 of the metering system 30 may be displayed or analyzed as a waveform plot. As depicted ion FIG. 3, the waveform plot may include a magnitude range 74 of positive and negative values and a zero magnitude axis or time range 76 of both positive and negative values. Specifically, the waveform plot may include a voltage output 78 (e.g., voltage), a current output 80 (e.g., current), and a power 82 (e.g., power), as depicted in FIG. 3. The voltage output 78 measured by the metering system 30 may be a constant AC voltage. For example, as previously noted, the metering system 30 may be a residential or commercial power meter, in which case the voltage output 78 may be a constant 120 VAC or 230 VAC, respectively. Similarly, the current output 80 may be an AC current. However, the current output 80 may or may not be constant, as the current output 80 may depend on the connected load demand such as, for example, the commercial sites 32 or the residences 34. As will be discussed in further detail below, in certain embodiments, the current output 80 may be an asymmetrical current, in which the current output 80 may include an instantaneous AC current (i.e., a symmetrical or steady-state sinusoidal current) component and a DC offset (i.e., an exponentially decaying current) component.

The power 82 (e.g., power) is the product of the voltage output 78 and the current output 80. For example, the power 82 may be a real power value (e.g., Wh or kWh) delivered to a load such as commercial sites 32 or the residences 34. Accordingly, the power 82 may, in most instances, represent a plot of positive values specifically when the voltage output 78 (e.g., voltage) and current output 80 (e.g., current) are theoretically in phase with one another and cross a zero crossing 83 at substantially the same time. However, as will be appreciated, in some embodiments, influence of DC current may advance and begin to distort the current output 80, resulting in a negative power 82 (e.g., the product of the voltage output 78 and the current output 80) as illustrated in FIG. 4 with respect to a point 86 of the power 82. In such a case, the metering system 30 may measure an inaccurate and inexact accumulation of power, leading to incorrect billing for consumer power usage or incorrect crediting of consumer power generation by the utility. Accordingly, it should be appreciated that the waveform plot of FIG. 3 represents a theoretical depiction of the voltage output 78 (e.g., voltage), current output 80 (e.g., current), and power as the product of voltage and current 82 (e.g., power).

More typically, the current output 80 (e.g., current) may be an asymmetrical current, which may be composed of a symmetrical instantaneous current component and DC offset current component. As depicted in FIG. 4, the influence of the DC offset current component of the current output 80 may contribute to a shift 84 in the zero crossing (e.g., zero crossing 83 of FIG. 3) between the voltage output 78 and the current output 80. The shift 84 may further cause the power 82, or the product of the voltage output 78 and the current output 80, to constitute negative values. More particularly, the DC influence on the current output 80 may contribute to a distortion of the current output 80, and thus causes the processor 46 to compute negative values of the power 82. For example, as illustrated with respect to point 86 of the power 82 (e.g., power), the power 82 drifts into the negative range of the magnitude range 74. Without power accumulation correction, the processor 46 of the metering system 30, if sampling and summing the voltage output 78 and the current output 80, may compute or sum positive values of the power 82 until point 86, where the processor 46 may then sum inaccurate (e.g., negative) values of the power output 82. Again, without power accumulation correction, this would enable the consumer to consume at least some power at presumably no cost, or in the case that the consumer may generate power, go uncompensated for power generated and transported to, for example, the power grid 24, 26.

Turning now to FIG. 5, a flow diagram is presented, illustrating an embodiment of a process 100 useful in detecting and correcting the power 82 of the metering system 30 depicted in FIG. 2. For the purpose of illustration, the process 100 may be discussed with respect to FIG. 4 and FIG. 5. The process 100 may include code or instructions stored in a non-transitory machine-readable medium (e.g., the memory 48) and executed, for example, by the processor 46. The processor 46 of metering system 30 may continuously or periodically perform the process 100 presented in FIG. 5 to constantly monitor and correct the accumulated power registered by metering system 30. For example, the processor 46 of the metering system 30 may periodically perform the process 100 during normal operating conditions (e.g., power service consumed or generated as authorized), but may continuously or periodically also perform the process 100 during times of restricted power usage due to the utility 12 or the consumer 32, 34. It should also be appreciated that the code and/or instructions may be flash upgraded to the memory 48, and executed by the processor 46, such that no additional hardware components is required by the metering system 30 to perform the presently disclosed techniques.

The process 100 may begin (block 102 of FIG. 5) with the processor 46 of the metering system 30 summing (block 104 of FIG. 5) the absolute value of the product of the nominal voltage (e.g., voltage output 78 of FIG. 4) and the current (e.g., current output 80 of FIG. 4) detected by current sensor 60 to compute a real power in watt-hours (Wh) or in kilowatt-hours (kWh) and reactive power in var-hours (Varh) or in kilovar-hours (kVarh) over, for example, an approximately 1, 2, 5, 10, 15, 30, 45, 60, 120, 230 minute duration or time interval. For example, as previously discussed, the electric utility may program the metering system 30 to record and store the power consumed at a residential, commercial, industrial, or other facility over a 60-minute duration of time for appropriate billing purposes. Nevertheless, it should be noted that the metering system 30 may be configured to measure a real power and a reactive power over any time interval. As also previously noted, the processor 46 of the metering system 30 may perform a series of calculations to determine the amount of measured power over a time interval, and to sum the absolute value of the measured power to a total accumulated power, which may be stored, for, example, in the memory 48 of the metering system 30.

In certain embodiments, the processor 46 of the metering system 30 may compute and sum (block 104 of FIG. 5) the absolute value of the measured power (e.g., power 82 of FIG. 4) by implementing signed magnitude techniques. For example, the processor 46 may encode positive and negative values of the sampled power 82 by assigning the leftmost (e.g., most significant bit [MSB]) bit of the sampled power value to be a sign (e.g., positive or negative) bit. That is, if the leftmost bit or MSB is 0, for example, then the measured and sampled value of power 82 may be positive. Likewise, if the leftmost bit or MSB is 1, for example, then the measured and sampled value of power 82 may be negative. The remaining bits may represent the magnitude of the sampled power 82 value. Accordingly, to ensure the summation of only the absolute value of the sampled values of the power 82 of FIG. 4, the processor 46 may convert any negative sampled values (e.g., values having a 1 as the MSB) to positive values (e.g., values having a 0 as the MSB). It should also be appreciated that the processor 46 may also implement one's and two's complementation, binary coded decimal, among other techniques to represent positive and negative values of the sampled power output 82.

The processor 46 may determine (decision 106 of FIG. 5) whether or not the sampled power may be delivered power (e.g., power delivered to be consumed by consumers 32, 34) over some time interval (e.g., 60-minutes). If the sampled power is indeed delivered power, then the processor 46 may add the sampled power for the given time interval to the total accumulated power (block 108 of FIG. 5), thus recording and reporting (e.g., to the utility control center 14 and/or the consumers 32 and 34) an accurate and correct measurement of accumulated power to, for example, the utility or the consumer. On the other hand that the sampled power may not be delivered power, the processor 46 may determine (decision 110 of FIG. 5) whether or not the sampled power is received power (e.g., power generated by consumers 32, 34 to be transported to the power distribution grid 26). Accordingly, if the sampled power is received, then the processor 46 may subtract (block 112 of FIG. 5) the sampled power over the given time interval from the total accumulated power and again report an accurate and correct measurement of accumulated power to, for example, the utility (e.g., utility control center 14) or the consumer (e.g., consumers 32 and 34). As discussed above, the process 100 may then be repeated over a number of time intervals.

Technical effects of the invention include the detection and correction of the accumulation of power measured and registered by smart meters. By detecting, recording, and computing the absolute value of power either delivered or received from a consumer or other load over given time intervals, and summing the total accumulation of power, the systems and methods described herein may ensure that the smart meter may compute and measure power either used or generated over a time interval as a positive value, thus yielding the correct accumulation of power delivered or received from a consumer or other load.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A meter, comprising:
a voltage sensor configured to measure a voltage over a time period; and
a current sensor configured to measure current over the time period;
a processor;
a memory including instructions that, when executed by the processor, cause the processor to perform operations comprising:
calculating, based on a product of the voltage over the time period and the current over the time period, a power over the time period;
summing an absolute value of the power over the time period;
determining whether the power over the time period is:
delivered to a load connected to the meter; or
received from a source connected to the meter;
correcting an accumulated power registered by the meter by performing one of:
adding the sum of the absolute value of the power over the time period to the accumulated power if the power over the time period is delivered to the load connected to the meter, and
subtracting the sum of the absolute value of the power over the time period from the accumulated power if the power over the time period is received from the source connected to the meter.

2. The meter of claim 1, wherein the voltage sensor and the current sensor are configured to measure a voltage and a current in a bus bar.

3. The meter of claim 2, wherein the current sensor comprises a current transformer.

4. The meter of claim 1, wherein there is a shift between a zero-crossing point in the voltage over the time period and a zero-crossing point in the current over the time period.

5. The meter of claim 1, wherein the meter is one of a single phase device and poly phase device.

6. The meter of claim 1, wherein the meter is an advanced meter infrastructure (AMI) smart meter.

7. The meter of claim 1, wherein the current over the time period includes an exponentially decaying direct current component.

8. The meter of claim 1, wherein determining whether the power is received or delivered is determined independent of a sign of the power over the time period.

9. A non-transitory computer readable medium including instructions stored therein that, when executed by a processor, cause the processor to perform operations comprising:
calculating by the processor, a power over a time period based on a product of:
a voltage measured over the time period, wherein the voltage is measured by a sensor at a bus of a meter; and
a current measured over the time period, wherein the voltage is measured by a sensor at the bus of the meter;
summing by the processor, an absolute value of the power over the time period;
determining by the processor, whether the power over the time period is:
delivered to a customer load connected to the meter;
or received from a customer source connected to the meter; and
correcting by the processor, an accumulated power registered by the meter by performing one of:
adding the sum of the absolute value of the power over the time period to the accumulated power if the power is delivered to the customer load connected to the meter, and
subtracting the sum of the absolute value of the power over the time period from the accumulated power if the power is received from the customer source connected to the meter.

10. The non-transitory computer readable medium of claim 9, wherein there is a shift between a zero-crossing point in the voltage over the time period and a zero-crossing point in the current over the time period.

11. The non-transitory computer readable medium of claim 9, wherein the current over the time period includes an exponentially decaying direct current component.

12. The non-transitory computer readable medium of claim 9, wherein determining whether the power is received or delivered is determined independent of a sign of the power over the time period.

* * * * *